(12) United States Patent
Park et al.

(10) Patent No.: US 7,199,019 B2
(45) Date of Patent: Apr. 3, 2007

(54) METHOD FOR FORMING TUNGSTEN CONTACT PLUG

(75) Inventors: Ji-Soon Park, Suwon-si (KR);
Hyun-Seok Lim, Suwon-si (KR);
Eung-Joon Lee, Yongin-si (KR);
Jung-Wook Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/002,682

(22) Filed: Dec. 3, 2004

(65) Prior Publication Data
US 2005/0146045 A1 Jul. 7, 2005

(30) Foreign Application Priority Data
Jan. 2, 2004 (KR) ............ 10-2004-0000055

(51) Int. Cl.
*H01L 21/76* (2006.01)
(52) U.S. Cl. ............... 438/424; 438/430; 257/E21.384; 257/21.549
(58) Field of Classification Search ......... 438/424, 438/427, 428, 430; 257/E21.384, E21.419, 257/E21.548, E21.549
See application file for complete search history.

(56) References Cited
U.S. PATENT DOCUMENTS
6,787,913 B2 * 9/2004 Yamada et al. ............ 257/774

FOREIGN PATENT DOCUMENTS

| JP | 10-177972 | 6/1998 |
|---|---|---|
| JP | 2001-156023 | 6/2001 |
| KR | 10-2001-0087917 | 9/2001 |
| KR | 2002-0072996 | 9/2002 |
| KR | 10-0363086 | 11/2002 |

OTHER PUBLICATIONS

Korean Office Action dated Sep. 23, 2005, for KR 10-2004-000055 with English Translation.

* cited by examiner

*Primary Examiner*—Walter L. Lindsay, Jr.
(74) *Attorney, Agent, or Firm*—Harness, Dickey & Pierce, P.L.C.

(57) ABSTRACT

A method for forming a tungsten contact plug of a semiconductor device including depositing an insulating layer on a semiconductor substrate, etching the insulating layer to form a contact hole, which exposes a conductive region, forming a barrier layer on the semiconductor substrate having the contact hole, changing characteristics of a portion of the barrier layer on the insulating layer and the portion of the barrier layer in the contact hold such that the characteristics between the barrier layer on the insulating layer and the barrier layer in the contact hole differ, depositing a tungsten layer for forming the tungsten contact plug, on the barrier layer, and removing the tungsten layer from the upper portion of the insulating layer to planarize the semiconductor device.

33 Claims, 5 Drawing Sheets

METHOD FOR FORMING TUNGSTEN CONTACT PLUG

PRIORITY STATEMENT

This application claims the benefit of Korean Patent Application No. 2004-00055, filed on Jan. 2, 2004, in the Korean Intellectual Property Office, which is incorporated herein in its entirety by reference.

BACKGROUND OF THE INVENTION

1. Field of the Invention

The present invention relates to a method for forming a semiconductor device. More particularly, the present invention relates to a method for forming a tungsten contact plug.

2. Description of the Related Art

Because semiconductor devices have become highly integrated and sizes of the semiconductor devices have been reduced, contact connections with higher aspect ratios may be used in a contact forming process. Void defects may occur in tungsten contact plugs even when the processes for formation of the contact are improved or optimized. This may be due to the present limits of semiconductor manufacturing equipment. As a result, it may be difficult to prevent the generation of void defects.

FIGS. 1 and 2 are sectional views illustrating a conventional method for forming a tungsten contact plug, and FIG. 3 is a plan view illustrating a planarized tungsten layer of FIG. 2.

Referring to FIGS. 1 through 3, a contact hole 40 for exposing a conductive region, may be formed on the semiconductor substrate 10 which may have an insulating layer 20. A titanium nitride (TiN) layer, which may be used as a barrier layer 30, may be formed on the resultant structure by a blanket method. A tungsten layer 60, which may function as a conductive layer, may be used to form a contact plug. A tungsten contact plug 60 may be formed by etching the tungsten layer 60 using chemical mechanical polishing (CMP) or an etchback process.

When filling the contact hole 40 using the tungsten layer 60, void defects 50 may occur in the tungsten layer 60 as shown in FIGS. 2 and 3. Void defects 50 may occur due to the different of deposition rates of the tungsten layer 60 inside the contact hole 40 and outside the contact hole 40 when depositing the tungsten layer 60 using chemical vapor deposition (CVD). More specifically, because the tungsten layer 60 may be deposited better outside the contact hole 40 than inside the contact hole 40, the inlet of the contact hole 40 may be clogged. As a result, a source gas, which may be used to deposit the tungsten layer 60 in the contact hole 40, may not be introduced inside the contact hole 40 and cause void defects 50 to occur.

The void defects 50 may deteriorate the electrical characteristic of a contact portion of semiconductor device. Therefore, the void defects 50 should be reduced and/or prevented in order to improve the characteristics of the semiconductor device.

SUMMARY OF THE INVENTION

Exemplary embodiments of the present invention provide a method for forming a tungsten contact plug of a semiconductor device to reduce or minimize the generation of void defects.

According to an exemplary embodiment of the present invention, a method is provided for forming a tungsten contact plug of a semiconductor device. An example method includes depositing an insulating layer on a semiconductor substrate, etching the insulating layer to form a contact hole, which exposes a conductive region, forming a barrier layer on the semiconductor substrate having the contact hole, changing characteristics of a portion of the barrier layer on the insulating layer and the portion of the barrier layer in the contact hole such that the characteristics between the barrier layer on the insulating layer and the barrier layer in the contact hole differ, depositing a tungsten layer for forming the tungsten contact plug, on the barrier layer, and removing the tungsten layer from the upper portion of the insulating layer to planarize the semiconductor device.

Another example method includes depositing an insulating layer on a semiconductor substrate, etching the insulating layer to form a contact hole, which exposes a conductive region, forming a barrier layer on the semiconductor substrate having the contact hole, depositing a deposition selectivity control layer on a portion of the barrier layer on the insulating layer, increasing an oxygen density of the deposition selectivity control layer, forming a tungsten layer whose deposition rate is different at the upper portion of the insulating layer and in the contact hole, and removing the tungsten layer from the upper portion of the insulating layer to planarize the semiconductor device.

Another example method includes depositing an insulating layer on a semiconductor substrate, etching the insulating layer to form a contact hole, which exposes a conductive region, forming an adhesive layer on the insulating layer, forming a barrier layer on the semiconductor substrate having the contact hole, depositing a deposition selectivity control layer on a portion of the barrier layer on the insulating layer, increasing an oxygen density of the deposition selectivity control layer, forming a tungsten layer whose deposition rate is different at the upper portion of the insulating layer and in the contact hole, on the semiconductor substrate, and removing the tungsten layer from the upper portion of the insulating layer to planarize the semiconductor device.

An example layer structure includes an insulating layer on a semiconductor substrate including a contact hole, which exposes a conductive region, a barrier layer formed on the insulating layer and the conductive region, wherein a portion of the barrier layer on the insulating layer and a portion of the barrier layer in the contact hole have different characteristics, and a deposition selectivity control layer formed on the barrier layer.

In order to change the characteristics of the portion of the barrier layer on the insulating layer and the portion of the barrier layer in the contact hole, a deposition selectivity control layer may be formed on the barrier layer located on the insulating layer so that the deposition selectivity of the tungsten layer, which may be deposited in a sequential process, may be altered. In an example embodiment, the contained amount of oxygen in the deposition selectivity control layer may be larger than the contained amount of oxygen in the barrier layer located in the contact hole.

The deposition selectivity control layer may be a titanium nitride (TiN) layer having a thickness of 20 to 40 Å. The deposition selectivity control layer may be formed by using $TiCl_4$ and $NH_3$ as source gases at a low temperature of 400 to 450° C. The step coverage characteristic of the deposition selectivity control layer may be lowered by controlling the supplied amount of $NH_3$.

An additional process for increasing oxygen density of the deposition selectivity control layer may include exposing the semiconductor substrate on which the deposition selectivity control layer is formed to air for 30 to 60 minutes to increase the oxygen density to 15 to 25%.

According to example embodiments of the present invention, the generation of void defects may be reduced when forming plugs, such as tungsten contact plugs of a semiconductor device by controlling the deposition rates of the tungsten layer inside the contact hole and/or outside the contact hole.

BRIEF DESCRIPTION OF THE DRAWINGS

The present invention will become more apparent through a description of the example embodiments thereof with reference to the attached drawings in which.

DETAILED DESCRIPTION OF EXAMPLE EMBODIMENTS OF THE INVENTION

The present invention will now be described more fully with reference to the accompanying drawings, in which example embodiments of the invention are shown. This invention may, however, be embodied in many different forms and should not be construed as being limited to the example embodiments set forth herein. Rather, these example embodiments are provided so that this disclosure will be thorough and complete, and will fully convey the concept of the invention to those skilled in the art.

Figure 4:
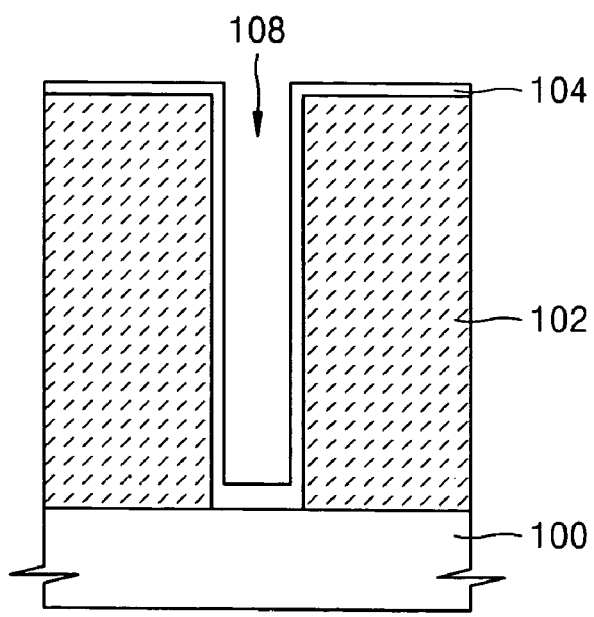
FIGS. 4 and 5 are sectional views illustrating a method for forming a deposition selectivity control layer according to an example embodiment of the present invention.
Figure 5:
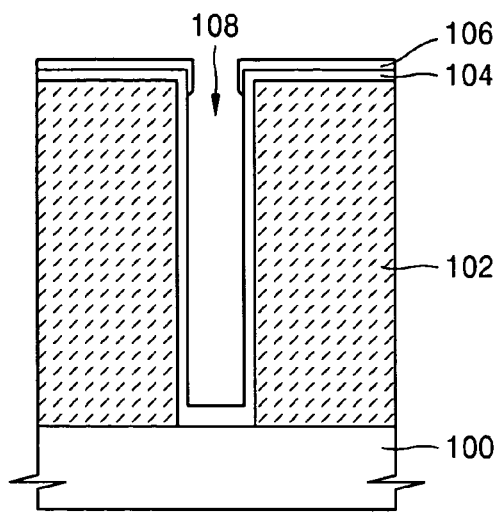

FIGS. 4 and 5 are sectional views illustrating a method for forming a deposition selectivity control layer according to an example embodiment of the present invention.

Referring to FIG. 4, a lower structure such as a transistor may be formed on a semiconductor substrate 100, and an insulating layer 102 may be formed on the semiconductor substrate 100. The insulating layer 102 may be an oxide based single layer or a multi-layer. A contact hole 108, which may expose a conductive region of the semiconductor substrate 100, may be formed by coating a photoresist layer on the insulating layer 102 and performing a photolithography process. The conductive region may be a region having conductivity due to doping impurities, such as source and/or drain regions. The conductive region may also be a metal layer and/or a metal plug having a higher conductivity, which may be formed on the semiconductor substrate 100.

A barrier layer 104, for example, a titanium nitride (TiN) layer, may be formed to a thickness of 100 to 150 Å, on the semiconductor substrate 100 having the contact hole 108 by chemical vapor deposition (CVD). A barrier layer 104 having sufficient step coverage characteristic may be formed using the TEL, which is known CVD equipment manufactured by Tokyo Electric Corporation. The barrier layer 104 may be formed at a temperature of over 600° C. by supplying $TiCl_4$ and $NH_3$ at a ratio of about 1:6. The barrier layer 104 may be a blanket type layer. The barrier layer 104 may have a lower resistivity while containing small amounts of chlorine and oxygen, where the contained amount of oxygen may be less than 10%. In addition, an optional titanium layer (not shown) may be deposited on the insulating layer 102 before forming the barrier layer 104 in order to improve adherence of the barrier layer 104. The additional titanium layer may have a thickness of 30 to 70 Å.

In order to make the layer characteristics of the barrier layer 104 inside the contact hole 108 and outside the contact hole 108 different from each other, a deposition selectivity control layer 106 may be formed. Referring to FIG. 5, the deposition selectivity control layer 106 may be formed on a portion of the barrier layer 104, which is on the upper portion of the insulating layer 102, while not being deposited entirely in the contact hole 108.

A tungsten layer may be formed by CVD. The deposition characteristic of the tungsten layer may be changed according to the characteristic of the barrier layer 104 as an underlying layer. More specifically, when the underlying layer is an oxide layer or a layer including a larger amount of oxygen, the nucleation rate of tungsten may be lowered while forming the tungsten layer. Accordingly, the deposition rate of the tungsten layer may be lowered.

This method of forming the tungsten layer may be done so that the deposition selectivity control layer 106 may be formed outside the contact hole 108 so that the amount of oxygen included in the portion of the barrier layer 104 inside the contact hole 108 may be different from the amount of oxygen in the portion of the barrier layer 104 outside the contact hole 108.

The deposition selectivity control layer 106 may include a large amount of oxygen. The deposition selectivity control layer 106 may be formed by using $TiCl_4$ and $NH_3$ as source gases at the temperature of 400 to 450° C. by CVD and/or atomic layer deposition (ALD). The contained amounts of chlorine and oxygen in the layer may increase in proportion to the lowering of the deposition temperature. As a result, the deposition temperature may range from 400 to 450° C., which may be lower than a typical deposition temperature of 600° C.

The amount of $NH_3$ gas may be controlled in order to lower the step coverage characteristic of the deposition selectivity control layer 106. The barrier layer 104, formed with TiN and prior to the deposition selectivity control layer 106, may have a sufficient step coverage characteristic. The TiN barrier layer 104 may be formed by supplying $TiCl_4$ and $NH_3$ at a ratio of 1:6. However, the deposition selectivity control layer 106 may be formed by supplying $TiCl_4$ and $NH_3$ at a ratio of 1:10 to 1:50. The amount of $NH_3$, with which the layer may be exposed to, may be increased to lower the step coverage characteristic of the deposition selectivity control layer 106. Accordingly, the deposition selectivity control layer 106, having a poorer step coverage characteristic, may be formed on the barrier layer 104 on the insulating layer 102 but not entirely formed in the contact hole 108.

In an example embodiment of the present invention, an optional additional process may be performed in order to increase the contained amount of oxygen contained in the deposition selectivity control layer 106. The additional process may include exposing the semiconductor substrate, on which the deposition selectivity control layer 106 is formed, to air for about 30 to 60 minutes to increase the contained amount of oxygen in the deposition selectivity control layer 106. As described above, the deposition selectivity control layer 106, which may be formed at the lower temperature range of 400 to 450° C., may include large amounts of chlorine and/or oxygen. When the deposition selectivity control layer 106 is exposed to air, chlorine included in the deposition selectivity control layer 106 may be replaced with oxygen. Accordingly, the amount of oxygen in the deposition selectivity control layer 106 may be increased to about 15 to 25%. Thus, the deposition rate of the tungsten layer may be lowered where the deposition selectivity control layer 106 may be formed.

Figure 6:
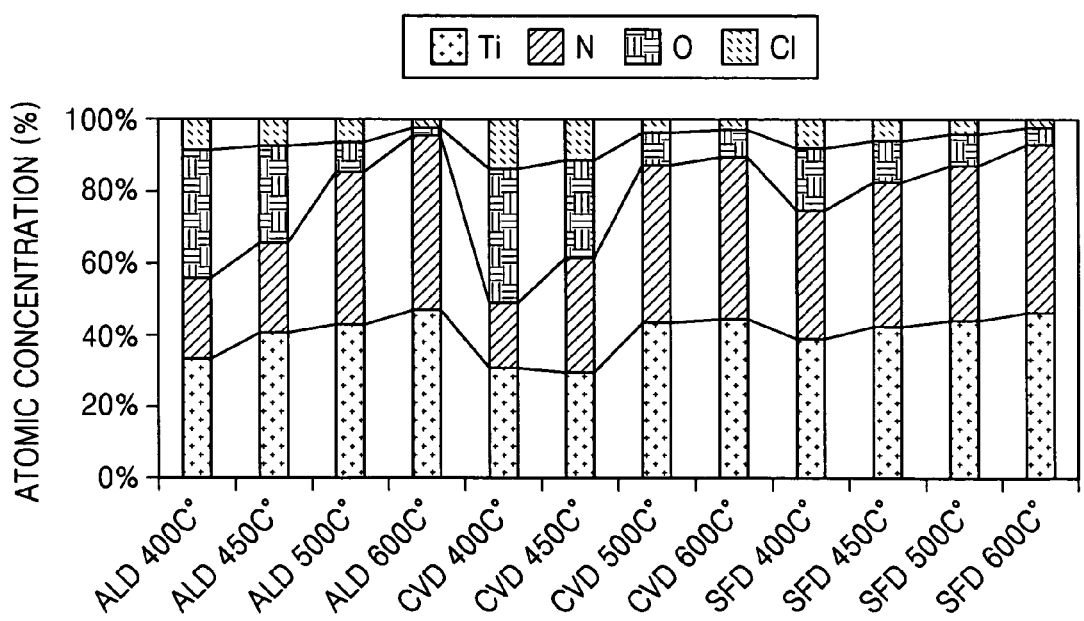
FIG. 6 is a graph illustrating an example method for forming the deposition selectivity control layer.

FIG. 6 is a graph illustrating a method for forming the deposition selectivity control layer 106 according to an example embodiment of the present invention.

Referring to FIG. 6, the example graph illustrates the amounts of chlorine and oxygen included in the deposition selectivity control layer 106 when the deposition selectivity control layer 106 is formed under various conditions. The X-axis may denote the conditions for forming the deposition selectivity control layer 106, and the Y-axis may denote the amounts of titanium (Ti), nitrogen (Ni), oxygen (O), and chlorine (Cl) in the deposition selectivity control layer 106. The graph may be constructed from results based on measurements using Auger electron spectroscopy (AES).

Table 1 denotes example resistivity and the contained amounts of chlorine and oxygen of the TiN layer as the deposition selectivity control layer 106, which is formed under the various conditions.

Figure 7:
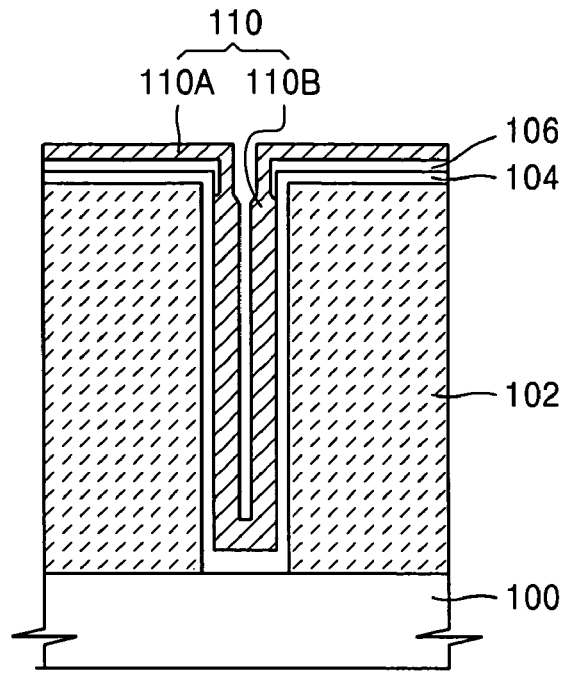
FIGS. 7 through 9 are sectional views illustrating a method for forming a tungsten contact plug of a semiconductor device according to an example embodiment of the present invention.
Figure 8:
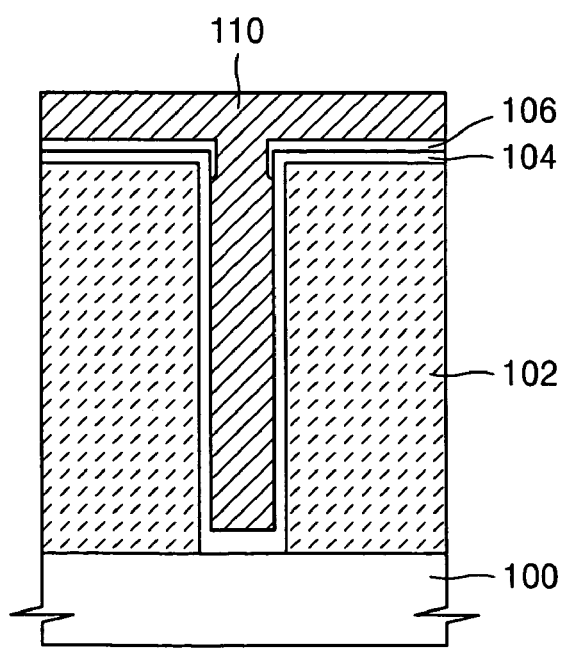
Figure 9:
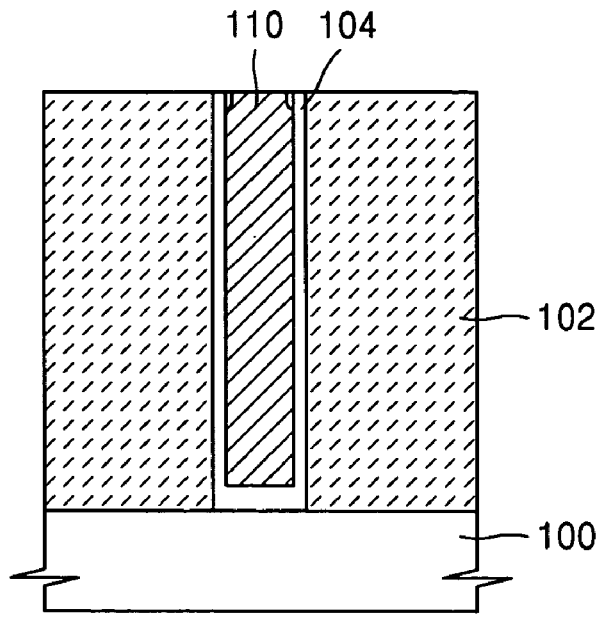

FIGS. 7 through 9 are sectional views illustrating a method for forming the tungsten contact plug of the semiconductor device according to an example embodiment of the present invention.

Referring to FIGS. 7 and 8, a tungsten layer 110 may be deposited in the contact hole and on the semiconductor substrate 100 to a sufficient thickness, by conventional CVD. A deposition selectivity control layer 106 may control the deposition rate of the tungsten layer 110. Accordingly, the deposition rate of the tungsten layer 110 may be higher in the contact hole but lower outside the contact hole, where the region where the deposition selectivity control layer 106 may be formed as the underlying layer. Thus, the tungsten layer 110 may be more rapidly deposited in the contact hole as shown in FIG. 7 to fill the inside of the contact hole. Because the deposition rate of a tungsten layer 110B in the contact hole may be higher than the deposition rate of a tungsten layer 110A outside the contact hole, the possibility generating void defects may be reduced.

Referring to FIG. 9, the portion of the tungsten layer 110 on the insulating layer 102 may be removed by chemical mechanical polishing (CMP) and/or etchback of the semiconductor substrate 100 on which the tungsten layer 110 is formed. During this process, the deposition selectivity control layer 106 may also be removed from the upper portion of the insulating layer 102 along with the tungsten layer 110. Because the deposition selectivity control layer 106, which

TABLE 1

|  | CVD TiN | | | SFD TiN | | | ALD TiN | | |
| --- | --- | --- | --- | --- | --- | --- | --- | --- | --- |
|  | resistivity | Cl % | O % | resistivity | Cl % | O % | resistivity | Cl % | O % |
| 600° C. | 300 | 3.0 | 7.3 | 250 | 2.5 | 404 | 165 | 2.3 | 1.9 |
| 500° C. | 2300 | 3.5 | 8.4 | 750 | 4.1 | 8.2 | 1250 | 6.5 | 7.8 |
| 450° C. | 7500 | 10.6 | 20 | 1500 | 5.6 | 11.3 | 2086 | 7.0 | 25 |
| 400° C. | 55000 | 13.2 | 35.5 | 3500 | 8.0 | 17 | 5204 | 7.5 | 32.5 |

TABLE 2

| | TiN deposition condition | | Thickness (Å) | Tungsten layer deposition condition | |
| --- | --- | --- | --- | --- | --- |
| | Temperature (° C.) | Thickness(Å) | | Deposition Rate (Å/sec) | Dependency on underlying layer |
| PVD TiN | R/T | 500 | 608 | 152 | 101% |
| CVD TiN | 700 | 250 | 610 | 153 | 102% |
| ALD TiN | 450 | 400 | 342 | 85 | 56%* |
| | 500 | 250 | 547 | 137 | 90% |
| | 600 | 500 | 628 | 157 | 103% |

Referring to Table 2, when the TiN layer is formed at a temperature of 450° C. using atomic layer deposition (ALD), the deposition rate of the tungsten layer may be lowered by about 50% when compared to the case where the TiN layer formed by physical vapor deposition (PVD) or CVD at a temperature of 700° C.

As a result, the underlying layer, for example, the deposition selectivity control layer 106 with a large amount of oxygen may lower the deposition rate of the tungsten layer.

may have a higher resistivity, may be used while depositing the tungsten layer 110 and then removed in a subsequent process, the deposition selectivity control layer 106 may not affect the characteristic of the semiconductor device.

Figure 10:
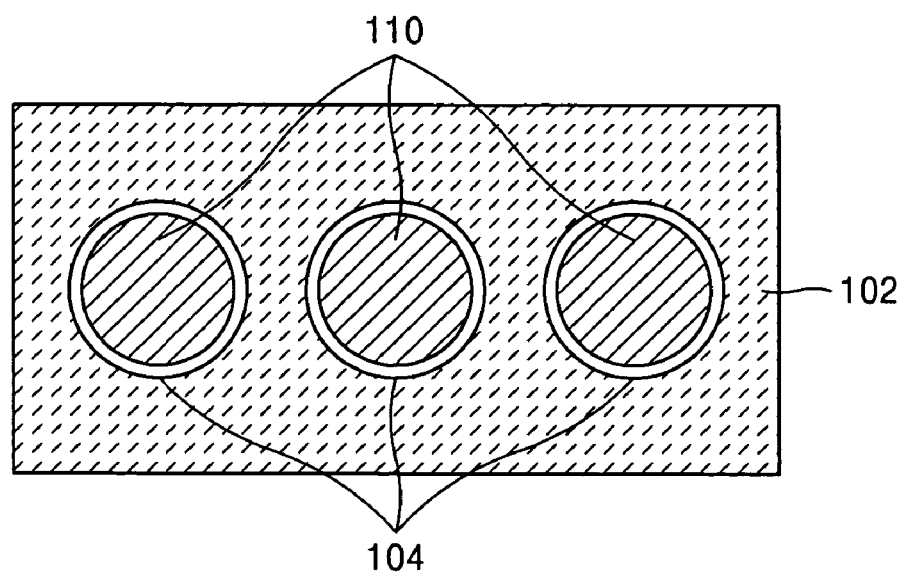
FIG. 10 is an illustration of a plan view of the tungsten contact plug according to an example embodiment of the present invention.

FIG. 10 is a plan view of the tungsten contact plug of FIG. 9.

Figure 1:
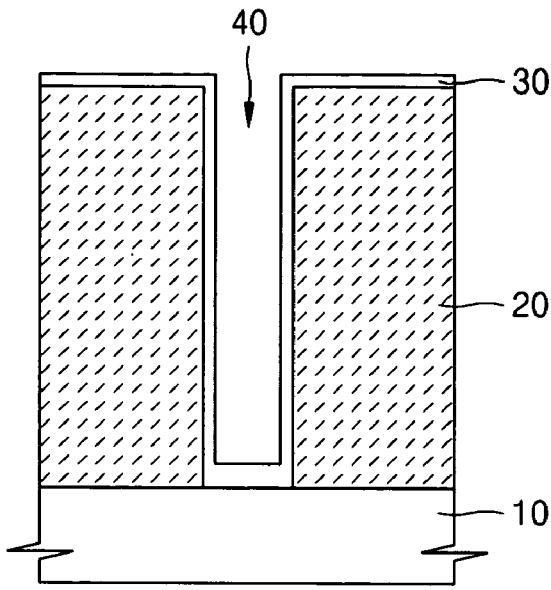
FIGS. 1 and 2 are sectional views illustrating a conventional method for forming a tungsten contact plug.
Figure 2:
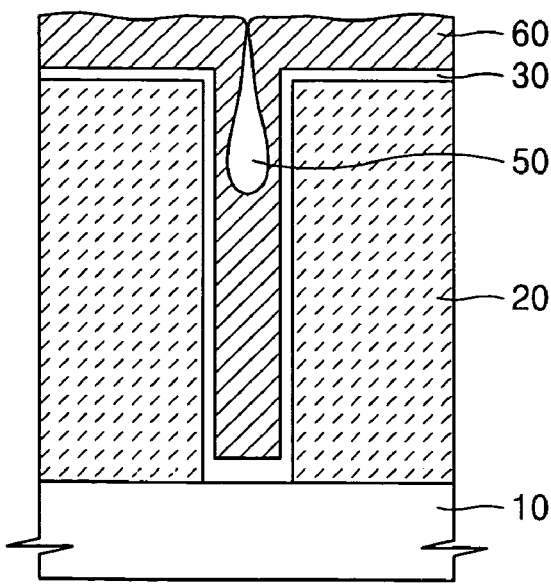
Figure 3:
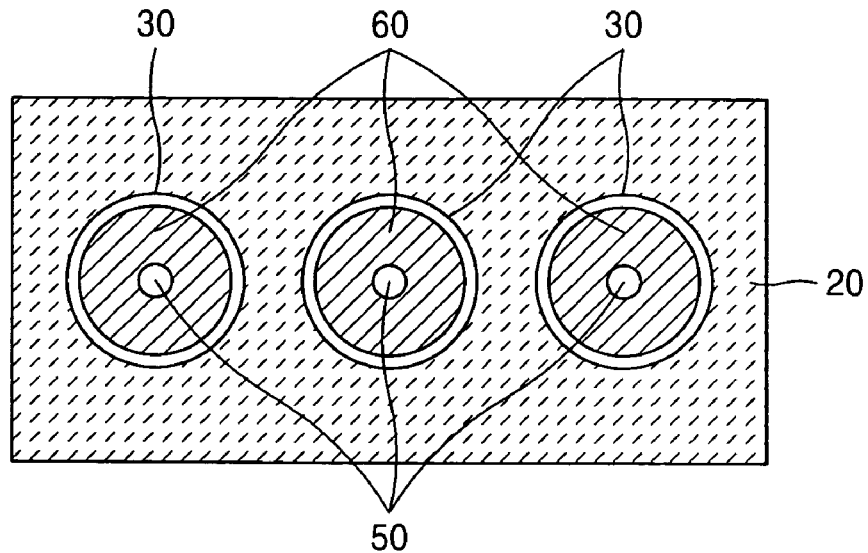
FIG. 3 illustrates a plan view of a planarized tungsten layer of FIG. 2.

When the tungsten contact plug is formed by a conventional method, void defects may occur due to the limits of semiconductor device manufacturing equipment and processes, as shown in FIG. 3. However, in the example embodiments of the present invention, the generation of void defects may be reduced or minimized, for example, by using a deposition selectivity control layer, as shown in FIG. 10.

Although exemplary embodiments of the present invention described above disclose changing characteristics of a portion of the barrier layer via the addition of a deposition selectivity control layer, deposition selectivity and/or changing characteristics of the portion of the barrier layer may be achieved in other ways. For example, the characteristics of a portion of the barrier layer or the deposition selectivity may be modified by, for example, ion implantation.

Although exemplary embodiments of the present invention have been described in conjunction with a tungsten contact plug, any plug, or any contact plug, made of any suitable material could also be formed.

According to example embodiments of the present invention, the deposition rate of the tungsten layer may be controlled inside the contact hole and outside the contact hole by using a deposition selectivity control layer. Thus, the generation of voids in the tungsten contact plug of the semiconductor device may be reduced.

While this invention has been particularly shown and described with reference to the example embodiments thereof, it will be understood by those skilled in the art that various changes in form and details may be made therein without departing from the spirit and scope of the invention as defined by the appended claims.

What is claimed is:

1. A method for forming a tungsten contact plug of a semiconductor device, comprising:
    depositing an insulating layer on a semiconductor substrate;
    etching the insulating layer to form a contact hole, which exposes a conductive region;
    forming a barrier layer on the semiconductor substrate having the contact hole;
    changing characteristics of a portion of the barrier layer on the insulating layer and the portion of the barrier layer in the contact hole by changing the deposition selectivity of the tungsten layer such that the characteristics between the barrier layer on the insulating layer and the barrier layer in the contact hole differ;
    depositing a tungsten layer for forming the tungsten contact plug, on the barrier layer; and
    removing the tungsten layer from the upper portion of the insulating layer to planarize the semiconductor device.

2. The method of claim 1, wherein the insulating layer is an oxide based single layer.

3. The method of claim 1, wherein the insulating layer is a multi-layer including an oxide layer.

4. The method of claim 1, wherein the conductive region is between the insulating layer and the semiconductor substrate.

5. The method of claim 4, wherein the conductive region is a conductive metal layer.

6. The method of claim 4, wherein the conductive region is a region having doping impurities.

7. The method of claim 1, wherein the barrier layer is of blanket type.

8. The method of claim 1, wherein the barrier layer is a titanium nitride layer (TiN).

9. The method of claim 8, wherein the titanium nitride (TiN) layer has a thickness of 100 to 150 Å.

10. The method of claim 9, wherein the titanium nitride (TiN) layer is formed from $TiCl_4$ and $NH_3$ using chemical vapor deposition (CVD) at a temperature greater than 600° C.

11. The method of claim 1, further comprising depositing a titanium layer between the barrier layer and the insulating layer.

12. The method of claim 11, wherein the titanium layer has a thickness of 30 to 70 Å.

13. The method of claim 1, wherein changing the barrier layer to change the deposition selectivity of the tungsten layer is performed by controlling a contained amount of oxygen in the barrier layer.

14. The method of claim 1, wherein controlling the contained amount of oxygen in the barrier layer is performed by forming a deposition selectivity control layer on the barrier layer on the insulating layer.

15. The method of claim 14, wherein the deposition selectivity control layer is a titanium nitride (TiN) layer.

16. The method of claim 15, wherein the titanium nitride layer is formed from $TiCl_4$ and $NH_3$ using chemical vapor deposition (CVD) at a temperature range of 400 to 450° C.

17. The method of claim 15, wherein the titanium nitride layer is formed from $TiCl_4$ and $NH_3$ using atomic layer deposition (ALD) at a temperature range of 400 to 450° C.

18. The method of claim 14, wherein the deposition selectivity control layer is formed by depositing the deposition selectivity control layer and increasing the contained amount of oxygen in the deposition selectivity control layer.

19. The method of claim 18, wherein increasing the contained amount of oxygen includes exposing the deposition selectivity control layer to air for 30 to 60 minutes.

20. The method of claim 1, wherein the tungsten layer for forming contact plug is deposited by chemical vapor deposition (CVD).

21. The method of claim 1, wherein the semiconductor device is planarized by performing at least one of an etchback or chemical mechanical polishing (CMP) on the tungsten layer.

22. A method for forming a tungsten contact plug of a semiconductor device, the method comprising:
    depositing an insulating layer on a semiconductor substrate;
    etching the insulating layer to form a contact hole, which exposes a conductive region;
    forming a barrier layer on the semiconductor substrate having the contact hole;
    depositing a deposition selectivity control layer on a portion of the barrier layer on the insulating layer;
    increasing an oxygen density of the deposition selectivity control layer;
    forming a tungsten layer whose deposition rate is different at the upper portion of the insulating layer and in the contact hole; and
    removing the tungsten layer from the upper portion of the insulating layer to planarize the semiconductor device.

23. The method of claim 22, wherein the barrier layer is of blanket type.

24. The method of claim 22, wherein the deposition selectivity control layer is a titanium nitride (TiN) layer.

25. The method of claim 24, wherein the titanium nitride layer is formed from $TiCl_4$ and $NH_3$ as source gases using chemical vapor deposition (CVD) at a temperature range of 400 to 450° C.

26. The method of claim 24, wherein the titanium nitride layer is formed from $TiCl_4$ and $NH_3$ as source gases using atomic layer deposition (ALD) at a temperature range of 400 to 450° C.

27. The method of claim 24, wherein the deposition selectivity control layer is formed to a thickness of 20 to 40 Å.

28. The method of claim 25, wherein a step coverage of the deposition selectivity control layer is lowered by controlling an amount of $NH_3$.

29. The method of claim 22, wherein increasing oxygen density of the deposition selectivity control layer includes exposing the semiconductor substrate on which the deposition selectivity control layer is formed to the air for 30 to 60 minutes to increase the oxygen density.

30. A method for forming a tungsten contact plug of a semiconductor device, the method comprising:
    depositing an insulating layer on a semiconductor substrate;
    etching the insulating layer to form a contact hole, which exposes a conductive region;

forming an adhesive layer on the insulating layer;
forming a barrier layer on the semiconductor substrate having the contact hole;
depositing a deposition selectivity control layer on a portion of the barrier layer on the insulating layer;
increasing an oxygen density of the deposition selectivity control layer;
forming a tungsten layer whose deposition rate is different at the upper portion of the insulating layer and in the contact hole, on the semiconductor substrate; and
removing the tungsten layer from the upper portion of the insulating layer to planarize the semiconductor device.

31. The method of claim 30, wherein the barrier layer is of blanket type.

32. The method of claim 30, wherein the adhesive layer is titanium (Ti).

33. The method of claim 32, wherein the adhesive layer has a thickness of 30 to 80 Å.

* * * * *